(12) United States Patent
Colonna et al.

(10) Patent No.: US 6,867,724 B2
(45) Date of Patent: Mar. 15, 2005

(54) INPUT STAGE WITH SWITCHED CAPACITORS FOR ANALOG-DIGITAL CONVERTERS

(75) Inventors: Vittorio Colonna, Landriano (IT); Andrea Baschirotto, Tortona (IT); Gabriele Gandolfi, Siziano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/765,713

(22) Filed: Jan. 26, 2004

(65) Prior Publication Data

US 2004/0183705 A1 Sep. 23, 2004

(30) Foreign Application Priority Data

Jan. 28, 2003 (IT) ...................................... MI2003A0136

(51) Int. Cl.[7] ................................................. H03M 1/12
(52) U.S. Cl. ...................................... 341/172; 341/155
(58) Field of Search ................................ 341/172, 155, 341/122

(56) References Cited

U.S. PATENT DOCUMENTS

| | | | | |
|---|---|---|---|---|
| 4,196,419 A | * | 4/1980 | Brown | 341/156 |
| 5,703,589 A | * | 12/1997 | Kalthoff et al. | 341/172 |
| 5,745,002 A | * | 4/1998 | Baschirotto et al. | 327/554 |
| 5,760,728 A | * | 6/1998 | May et al. | 341/155 |
| 2003/0117307 A1 | * | 6/2003 | Deak | 341/145 |

* cited by examiner

*Primary Examiner*—Peguy JeanPierre
(74) *Attorney, Agent, or Firm*—Lisa K. Jôrgenson; Robert Iannucci; Seed IP Law Group PLLC

(57) ABSTRACT

An input stage includes switched capacitors for analog-digital converters. The stage comprises a first switched capacitor circuit structure suitable for sampling an analog signal in input to the converter with a preset sampling period, a buffer having in input the analog signal and that can be connected to the first circuit structure by means of a first and a second sampling switch of the first circuit structure coupled respectively with the output terminal and the input terminal of the buffer. The first and the second switch are controlled respectively by a first and a second signal to close respectively for a first interval of time and for a successive second interval of time of a first semi-sampling period of the analog signal. The stage comprises a second switched capacitor circuit structure connected to a reference voltage and to the buffer and suitable for generating the second signal with a value of voltage greater in absolute value than the value of the analog signal for the duration of the second interval of time of the semi-sampling period.

16 Claims, 5 Drawing Sheets

INPUT STAGE WITH SWITCHED CAPACITORS FOR ANALOG-DIGITAL CONVERTERS

BACKGROUND OF THE INVENTION

1. Field of the Invention

The present invention refers to an input stage with switched capacitors for analog-digital converters.

2. Description of the Related Art

Switched capacitor (SC) circuit structures used in analog-digital converters are generally known. The switched capacitor structures used for sampling an analog signal must have a greater sampling rate than the bandwidth of the signal that has to be converted. Said SC structures may be analog input structures of the analog-digital converters.

FIG. 1 shows an input circuit structure for an analog-digital converter. Said structure 90 is a switched capacitor structure comprising a first switch 1 connected on one side to a terminal Io on which the analog input signal Vin is present and on the other side connected to an armature A of capacitor Ci, a switch 2 positioned between the same armature A of the capacitor Ci and a reference voltage Vref1, a switch 3 positioned between the armature B of the capacitor Ci and another reference voltage Vref2, a switch 4 connected to the armature B and to a next stage of the analog-digital converter. The switches 1–4 are controlled by the signals f1 and f2 shown in FIG. 2; more precisely the switches 1 and 3 are controlled by the signal f1 and the switches 2 and 4 are controlled by the signal f2. The dimension of the capacitor Ci, the conductance during the ignition phase of the switches and the sampling period T determine the dynamic impedance of the structure. The rapid transient of the signal that passes through the elements of the structure 90 causes high current peaks, also called spikes, that can cause problems in the different applications in which said structure is used, for example problems of interfacing with devices on different chips. For this reason the driving stage of said circuit structure has to be carefully designed as in the case of high resolution analog-digital converters (more than 16 bit); in fact, in the latter, the design of said driving stage becomes more and more critical as it may worsen the performances of the converter itself.

Several solutions have been made for this aim.

One way for not having current spikes is to add an input buffer 10 to the structure 90 of FIG. 1 which has the aim of loading it, as shown in FIG. 3. The buffer should have a large bandwidth to guarantee a good regulation of the level of the input signal. This buffer represents an expensive solution in terms of area and power consumption and in addition it introduces noise that could worsen the performances of the entire converter.

Another solution consists of using a further switched capacitor structure 100 to reduce the ignition resistance of the structure 90 of FIG. 1, as can be seen in FIG. 4. The structure 100 is suitable for driving the switch 1 of the circuit structure of FIG. 1 that, in FIG. 4, is represented by a MOS transistor M. The structure 100 comprises the switches 101–103 driven by the signal f2, the switches 104 and 105 driven by the signal f1 and a capacitor Cb. The switch 101 is positioned between the first terminal of the capacitor Cb and the analog signal Vin while the switch 104 is positioned between said first terminal of the capacitor Cb and the gate terminal of the MOS transistor M. The switch 102 is positioned between the second terminal of the capacitor Cb and ground while the capacitor 105 is positioned between said second terminal of the capacitor Cb and a voltage Vdd; the switch 103 is positioned between the gate terminal of the transistor M and ground. The closing of the switches 101–103 permits the capacitor Cb to be loaded at the voltage Vin and to unload the intrinsic capacitances of the transistor M linked to the drain terminal. The successive closing of the switches 104 and 105 enables the MOS transistor M to be driven with a voltage between gate terminal and source terminal equal to Vdd since on the gate terminal the voltage Vdd+Vin is present. Said structure 100 guarantees good linearity of the signal in the input structure but the reduction of the ignition resistance causes an increase of the current spikes in input to the structure of FIG. 1.

A further solution is constituted by a capacitive sampling circuit shown in FIG. 5. Said circuit is similar to the circuit of FIG. 3 in which a switch 11 positioned between the input terminal IN of the buffer 10 and the terminal A of the capacitor Ci has been added. The switches 1 and 11 therefore become the first sampling switches of the structure 90; in fact they are controlled by the signals f1a and f1b shown in FIG. 6 that come from the signal f1 and which both contribute to loading the capacitor Ci up to the voltage level Vin. More precisely considering T as the sampling period, the first semi-sampling period T/2 is divided into two more semi-periods T/4; in the first period T/4 the signal f1a is positive and thus the switch 1 is active, while in the second period T/4 the signal f1b is positive and the switch 11 becomes active. With this solution the noise introduced by the buffer does not invalidate the performances of the converter as said buffer is disconnected during the second period T/4.

BRIEF SUMMARY OF THE INVENTION

One embodiment of the present invention provides an input stage with switched capacitors for analog-digital converters, which is able to improve the linearity and reduce the current spikes more than the input stages known.

One embodiment of the present invention provides an input stage with switched capacitors for analog-digital converters, the stage including a first switched capacitor circuit structure suitable for sampling an analog signal in input to the converter with un preset sampling period, a buffer having in input the analog signal and being connectable to the first circuit structure by means of a first and a second sampling switch of the first circuit structure coupled respectively with the output terminal and the input terminal of the buffer, the first and second switch being controlled respectively by a first and a second signal to close respectively for a first interval of time and for a successive second interval of time of a first semi-sampling period of the analog signal, characterised in that it comprises a second switched capacitor circuit structure connected to a reference voltage and a the buffer and suitable for generating the second signal with a voltage value greater in absolute value than the value of the analog signal for the duration of the second interval of time of the semi-sampling period.

BRIEF DESCRIPTION OF THE DRAWINGS

The characteristics and advantages of the present invention will appear evident from the following detailed description of an embodiment thereof, illustrated as a non-limitative example in the enclosed drawings, in which.

DETAILED DESCRIPTION OF THE INVENTION

Figure 6:
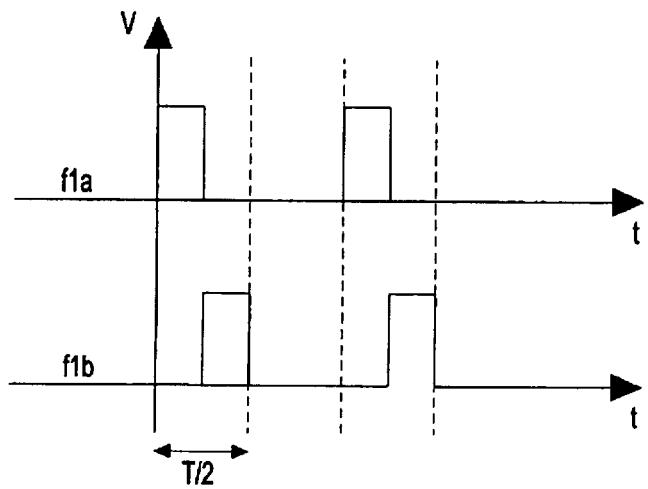
FIG. 6 is a graph of the control signals of several switches of FIG. 1 in function of the time.
Figure 7:
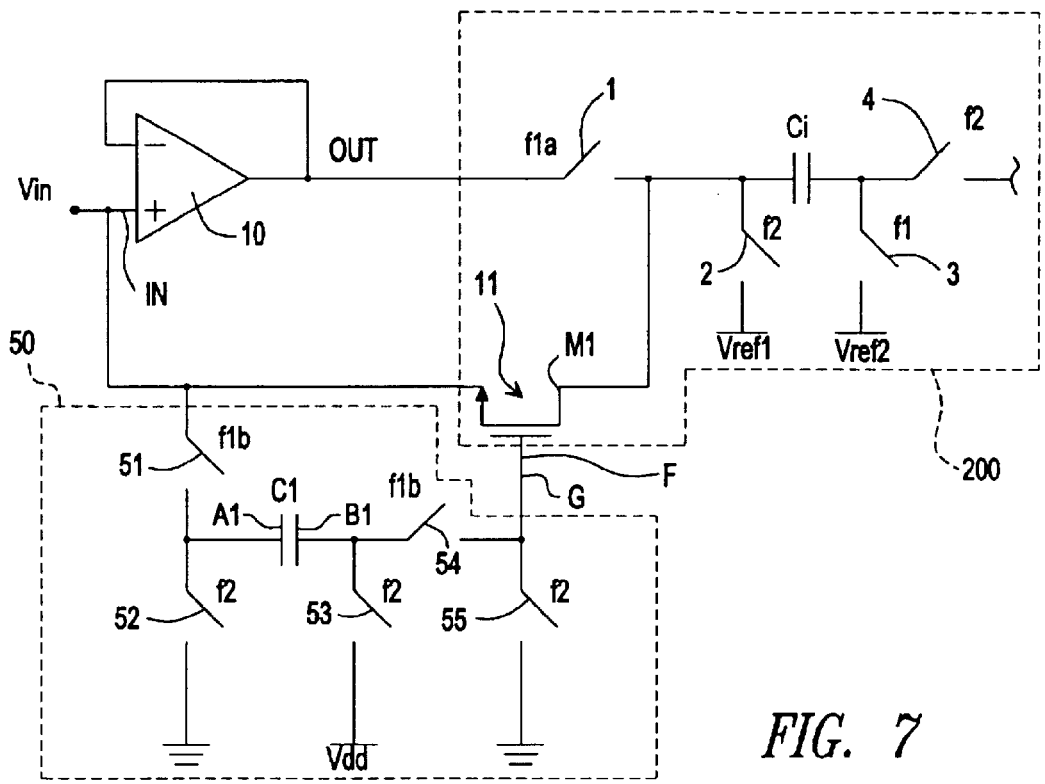
FIG. 7 is a schematic view of a switched capacitor circuit structure used as input stage for an analog-digital converter according to an embodiment of the present invention.

With reference to FIG. 7 description is made of an input stage with switched capacitors for analog-digital converters according to one embodiment of the present invention; the circuit elements already previously described will be indicated with the same numerical references. Said stage comprises a first switched capacitor structure 200 suitable for sampling the analog signal Vin in input to the analog-digital converter and a buffer 10 that has in input said analog signal Vin and the output terminal OUT connected to the circuit structure 200. The latter has two first sampling switches 1 and 11 driven by the f1a and F so as to be alternatively active in a half T/4 of the semi-sampling period T/2 of the analog signal Vin, that is respectively for a first and for a successive second interval of time T/4. The switches 1 and 11 are connected respectively with the output terminal OUT and input terminal IN of the buffer 10. The switch 11 is preferably constituted by a MOS transistor M1 on whose gate terminal G the driving signal F coming from a circuitry 50 lies. The latter is connected between the input terminal IN of the buffer 10 and the gate terminal of the transistor 11 and comprises a capacitor C1 having a terminal A1 that can be connected to the input terminal IN of the buffer 10 by means of a switch 51 and a terminal B1 that can be connected to the gate terminal of the transistor 11 by means of a switch 54; the signal f1b of FIG. 6 lies on the switches 51 and 54. The switches 52, 53 and 55 are driven by the signal f2 and respectively the switch 52 is positioned between the terminal A1 of the capacitor C1 and ground, the switch 53 is positioned between the terminal B2 of the capacitor C1 and a reference voltage Vdd, and the switch 55 is positioned between the gate terminal G of the transistor 11 and ground.

When the signal f2 is positive the switches 52, 53 and 55 are closed and this permits the loading of the capacitor C1 at the voltage Vdd and the unloading of the intrinsic capacities of the transistor 11 connected to the gate terminal; the signal F in said semi-period is at ground. When the signal f1b is positive, that is in the second interval of time T/4, the switches 51 and 54 are closed. In this manner we obtain on the gate terminal G of the transistor 11 a driving signal in voltage F greater in absolute value than the value of the voltage Vin; in this case a signal F on the gate terminal G equal to Vdd+Vin, that is a voltage between gate and source equal to Vdd that permits the switch 11 to be closed.

The use of a gate-source voltage equal to Vdd reduces the ignition resistance of the transistor 11 which is translated in a lower distortion of the signal that passes through the transistor 11.

It can be appreciated that the signal f1 is positive during the entire first semi-sampling period T/2 such that the switch 3 of the switched capacitor structure 200 is closed, while the switch 1 is closed by the signal f1a in the first interval T/4, and the switch 11 is closed by the signal f1a in the second interval T/4. When the signal f2 is positive during the entire second semi-sampling period T/2, the switches 2, 4 of the first switched capacitor structure 200 are closed along with the switches 52, 53, 55 of the second switched capacitor structure 50.

Figure 8:
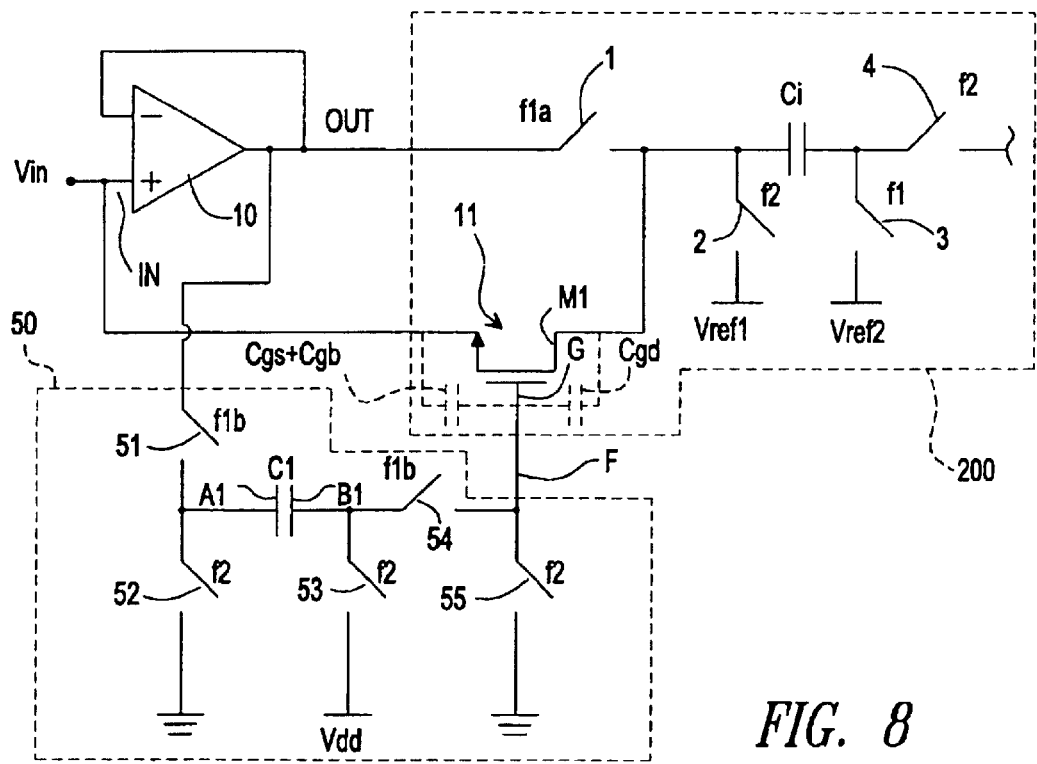
FIG. 8 is a schematic view of a switched capacitor circuit structure used as input stage for an analog-digital converter according to an alternate embodiment of the present invention.

FIG. 8 shows an input stage with switched capacitors for analog-digital converters according to an alternate embodiment of the present invention. In this variation the circuitry 50 for driving the transistor 11, in a different manner from the embodiment described in FIG. 7, is directly connected with the output terminal OUT of the buffer 10 instead of with the input terminal IN. In this manner the buffer 10 is used during the phase f1b to load the capacitor C1 of the circuitry 50 and the intrinsic capacitances to the MOS transistor 11 (shown in a dotted line in FIG. 8), that is the capacitance between gate and drain Cgd, the capacitance between gate and source Cgs and the capacitance between gate and substrate Cgb (which is normally connected between gate and ground but for the calculation of the total capacitance is shown in parallel with the capacitance Cgs). The total load capacitance CL that the buffer 10 has to load is given by $$CL = \frac{C1*(Cgd + Cgs + Cgb)}{C1 + Cgd + Cgb + Cgs}.$$

In this manner the input source that sends the signal Vin has to load a reduced capacitive load in comparison to the circuit of FIG. 7 and given exclusively by the sampling capacitor Ci; this permits the reduction of the current spikes.

Figure 1:
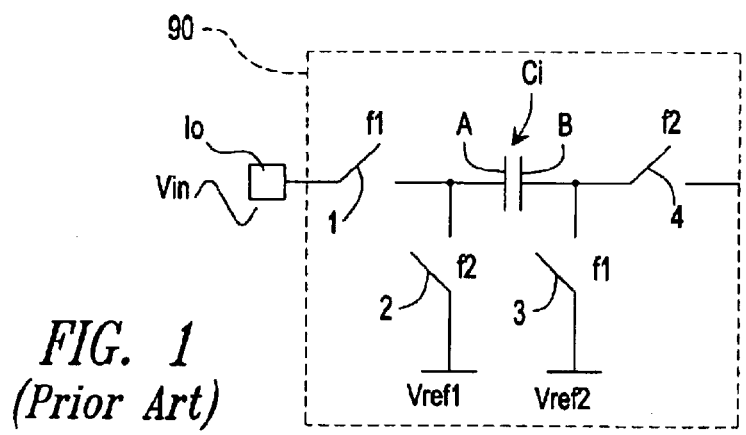
FIG. 1 is a schematic view of a switched capacitor circuit structure used as input stage for a analog-digital converter according to the known art.
Figure 2:
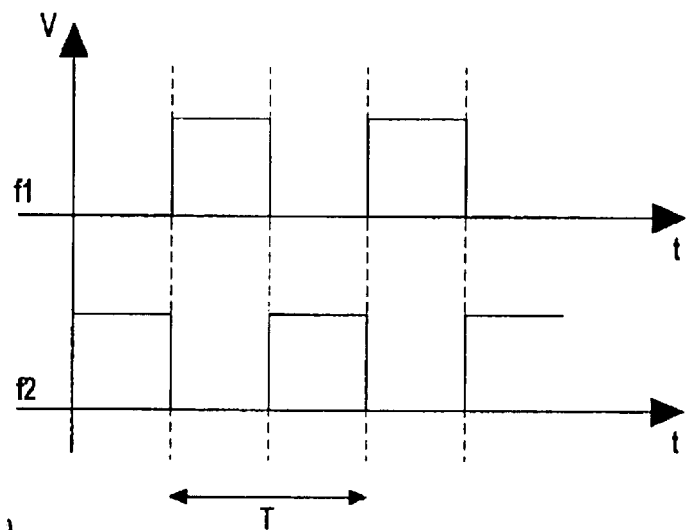
FIG. 2 is a graph of the control signals of the switches of FIG. 1 in function of the time.
Figure 3:
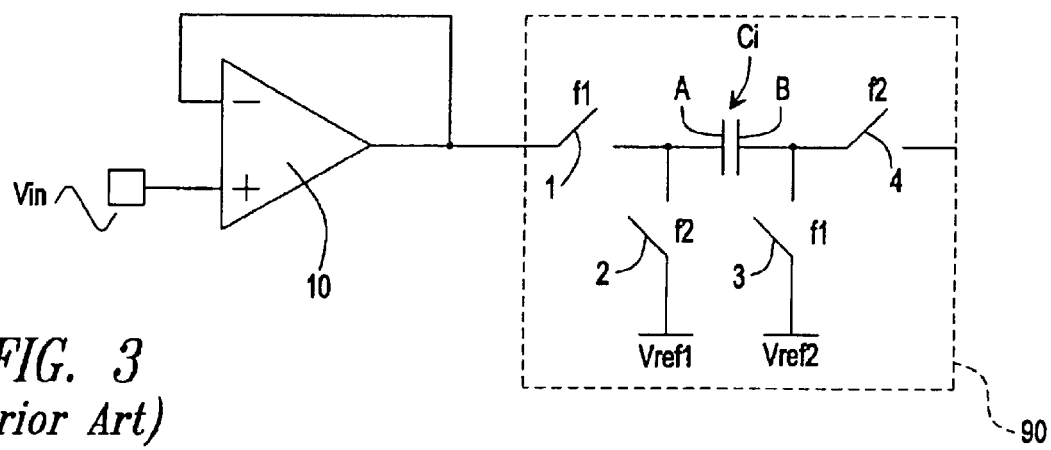
FIG. 3 is a schematic view of another switched capacitor circuit structure used as input stage for an analog-digital converter according to the known art.
Figure 4:
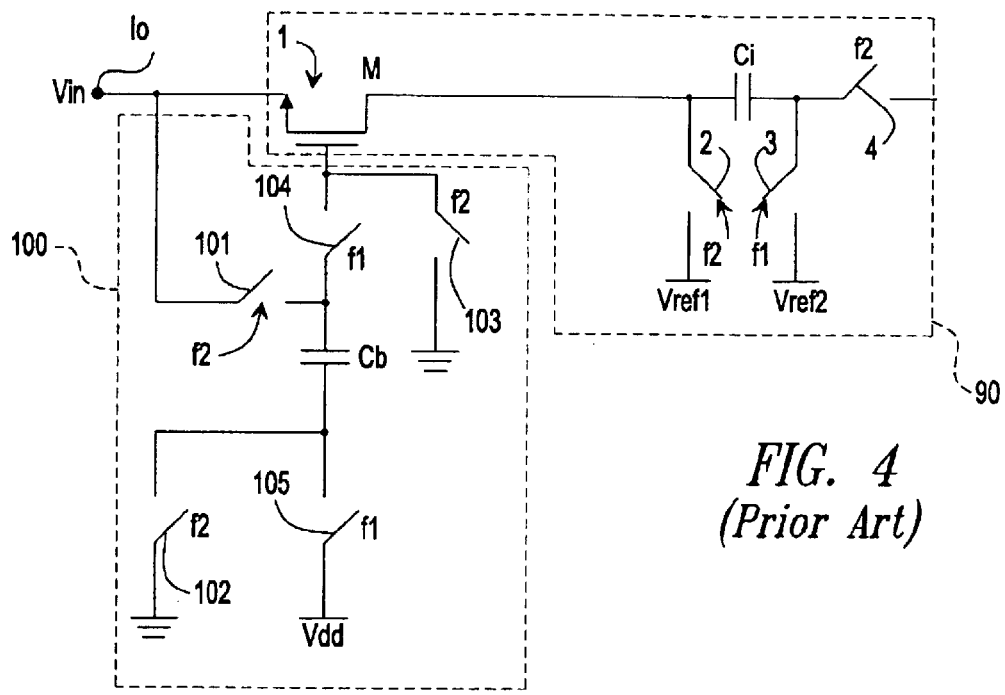
FIG. 4 is a schematic view of a further switched capacitor circuit structure used as input stage for an analog-digital converter according to the known art.
Figure 5:
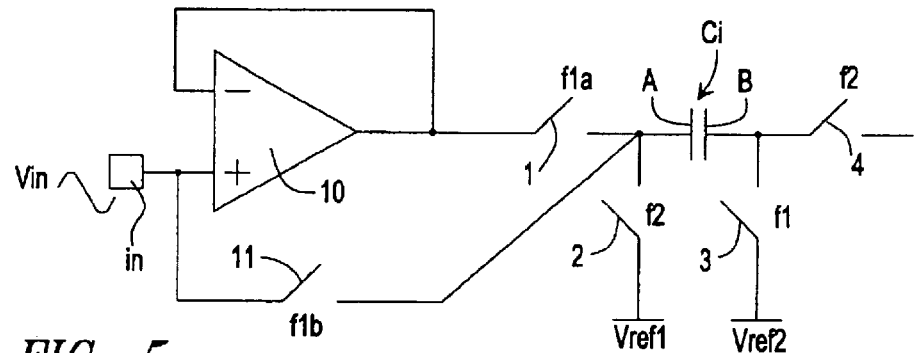
FIG. 5 is a schematic view of a further switched capacitor circuit structure used as input stage for an analog-digital converter according to the known art.
Figure 9:
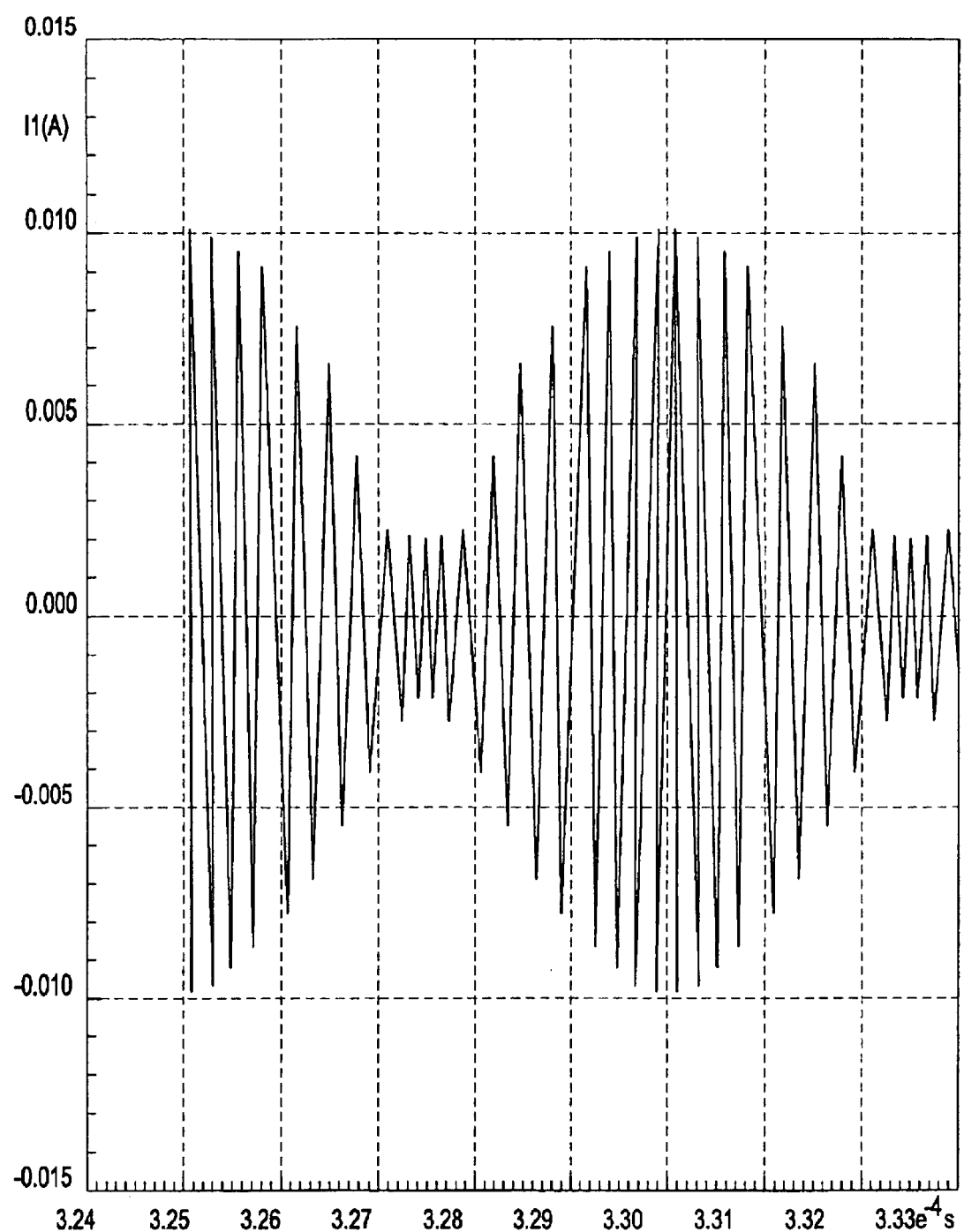
FIG. 9 is a time diagram of the current in input to the circuit structure of FIG. 1.
Figure 10:
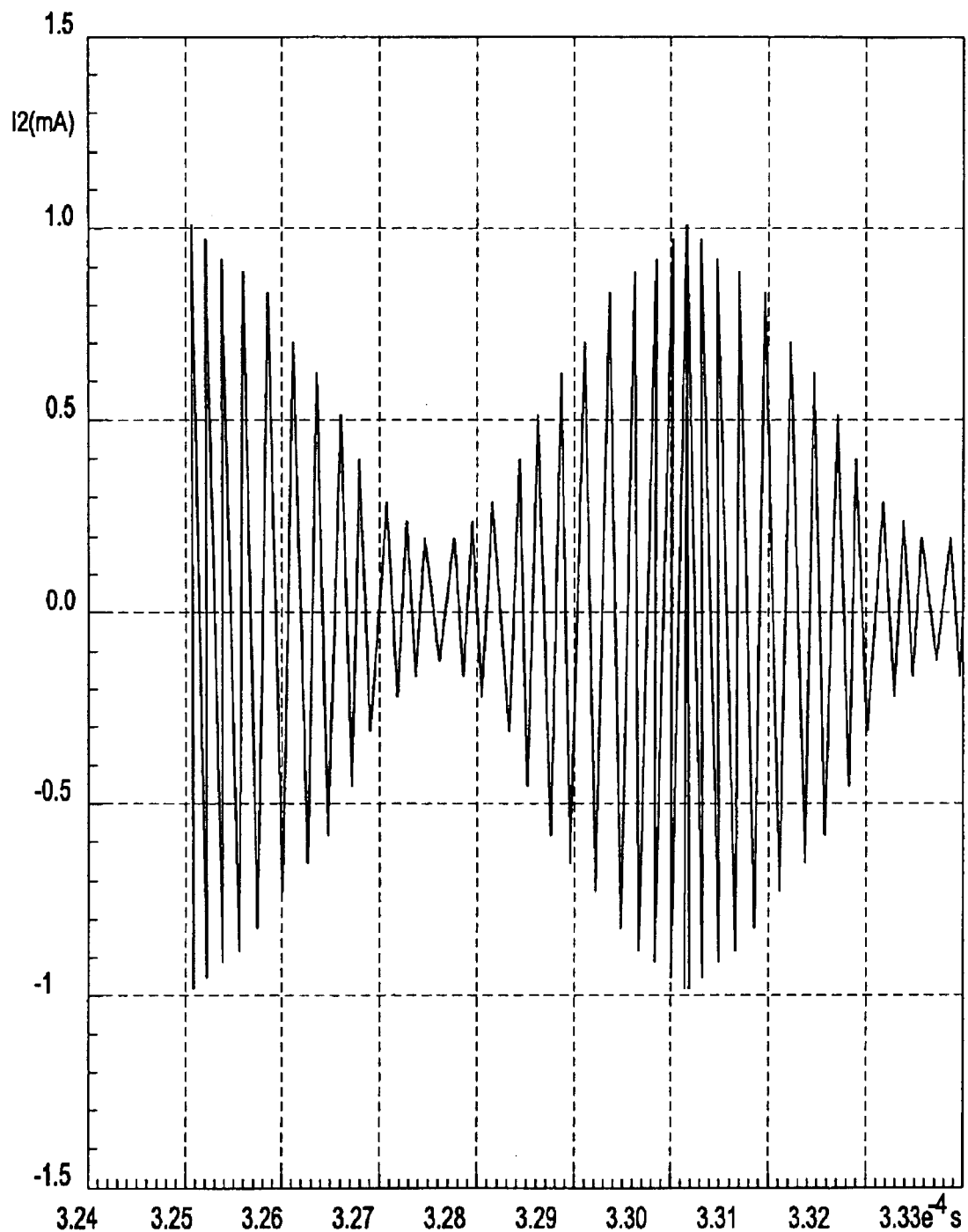
FIG. 10 is a time diagram of the current in input to the circuit structure of FIG. 8.

FIGS. 9 and 10 show time diagrams of the currents I1 and I2 on the input terminals Io and IN respectively of the circuitry typology of FIG. 1 and of that of FIG. 8 using a capacitor Ci=4.7 pF, a capacitor C1=2 pF and a buffer having a gain in voltage equalling 50 db and a frequency band of 400 Mhz. The diagram of FIG. 9 shows an input current I1 with variations between a positive peak and a negative peak of current greater than 20 mA, while the diagram of FIG. 10 shows an input current I2 with variations between a positive peak and a negative peak of current less than 2 mA. For the circuit typology of FIG. 7, even if it is not shown with a time diagram, a current on the input terminal IN is also obtained with variations between a positive peak and a negative peak of current of about 2.7 mA.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An input stage for an analog-digital converter, said stage comprising:
   a buffer having an input terminal that receives an analog signal, and an output terminal;
   a first switched capacitor circuit structure suitable for sampling the analog signal with a preset sampling period, the first switched capacitor circuit including first and second sampling switches coupled respectively with the output terminal and the input terminal of said buffer, said first and second sampling switches being controlled respectively by first and second signals to close respectively for a first interval of time and for a successive second interval of time of a first semi-sampling period of said sampling period; and
   a second switched capacitor circuit structure connected to a reference voltage and to said buffer and suitable for generating said second signal with a voltage value greater in absolute value than the value of said analog signal for the duration of said second interval of time of the semi-sampling period.

2. The input stage according to claim 1, wherein said second switched capacitor circuit structure is connected to the input terminal of said buffer.

3. The input stage according to claim 1, wherein said second switched capacitor circuit structure is connected to the output terminal of said buffer.

4. The input stage according to claim 1 wherein the voltage value of said second signal is greater in absolute value than the voltage value of the analog signal by a quantity basically equal to the voltage value of said reference voltage.

5. The input stage according to claim 4 wherein said second switch is a transistor having a driving terminal and said second circuit structure comprises a capacitor, a third switch connected between a first terminal of said capacitor and said reference voltage, a fourth switch connected between the second terminal of said capacitor and ground, said third and fourth switches being controlled to close during a second semi-sampling period so as to load said capacitor at a voltage value basically equal to said reference voltage, a fifth switch connected to said input terminal of said buffer and to said first terminal of the capacitor and a sixth switch connected between said second terminal of the capacitor and the driving terminal of said transistor, said fifth and sixth switches being active during the second interval of time of the first semi-sampling period to obtain said second signal on said driving terminal of the transistor.

6. The input stage according to claim 4 wherein said second switch is a transistor having a driving terminal and said second circuit structure comprises a capacitor, a third switch connected between a first terminal of said capacitor and said reference voltage, a fourth switch connected between the second terminal of said capacitor and ground, said third and fourth switches being controlled to close during a second semi-sampling period so as to load said capacitor at a value of voltage substantially equal to said reference voltage, a fifth switch connected to said output terminal of said buffer and a said first terminal of the capacitor and a sixth switch connected between said second terminal of the capacitor and the driving terminal of said transistor, said fifth and sixth switches being active during the second interval of time of the first semi-sampling period to obtain said second signal on said driving terminal of the transistor.

7. A sample and hold stage for an analog-digital converter, the stage comprising:
   a buffer having an input terminal that receives an analog signal, and an output terminal;
   a first switched capacitor circuit structure suitable for sampling the analog signal during a sampling period, the first switched capacitor circuit including first and second sampling switches coupled respectively with the output terminal and the input terminal of the buffer; and
   a second switched capacitor circuit structure connected to the buffer and including:
   a first capacitor having first and second electrodes;
   a first switch connected between the first electrode and a first reference voltage;
   a second switch connected between the second electrode and a second reference voltage;
   a third switch connected between the buffer and a first node between the first electrode and the first reference voltage; and
   a fourth switch connected between a control terminal of the second sampling switch and a second node between the second electrode and the second reference voltage.

8. The stage of claim 7 wherein the third switch is connected between the first node and the input terminal of the buffer.

9. The stage of claim 7 wherein the third switch is connected between the first node and the output terminal of the buffer.

10. The stage of claim 7 wherein the first sampling switch is controlled by a first signal that is active during a first interval of a first half of the sampling period, the third and fourth switches a controlled by a second signal that is active during a second interval of the first half of the sampling period, and the first and second switches are controlled by a third signal that is active during a second half of the sampling period.

11. The stage of claim 7 wherein the first switched capacitor circuit further includes:
   a second capacitor having a first electrode, connected to the first and second sampling switches, and a second electrode;
   a fifth switch connected between the second electrode of the second capacitor and an output of the stage;
   a sixth switch connected between the first electrode of the second capacitor and a third reference voltage; and
   a seventh switch connected between the second electrode of the second capacitor and a fourth reference voltage.

12. The stage of claim 11 wherein the first sampling switch is controlled by a first signal that is active during a first interval of a first half of the sampling period, the third and fourth switches a controlled by a second signal that is active during a second interval of the first half of the sampling period, and the first, second, fifth, and sixth switches are controlled by a third signal that is active during a second half of the sampling period.

13. The stage of claim 7 wherein the first switched capacitor circuit further includes a fifth switch connected between the first reference voltage and a third node between the fourth switch and the control terminal of the second sampling switch.

14. A method of driving a sampling stage of an analog-digital converter during a sampling period, the sampling stage including first and second sampling switches connected between an input terminal, which receives an analog input signal, and a first capacitor, the method comprising:

using a first signal to close the first sampling switch for a first interval of a first half of the sampling period;

generating a second signal with a voltage value greater in absolute value than the analog input signal using the second signal to close the second sampling switch for a second interval of the first half of the sampling period.

16. The method of claim 14 wherein the generating step is performed by a switched capacitor circuit that includes a second capacitor, the generating step including applying a first reference voltage across the second capacitor and disconnecting the second capacitor from the input terminal and the second sampling switch during a second half of the sampling period, the second half occurring before the first half, and connecting the second capacitor between the input terminal and a control terminal of the second sampling switch during the first half such that the second signal is substantially equal in voltage to the analog input signal plus the first reference voltage.

16. The method of claim 15, further comprising connecting the first capacitor between a second voltage reference and an output of the sampling stage during the second half.

* * * * *